(12) United States Patent
Hyun et al.

(10) Patent No.: US 9,093,580 B2
(45) Date of Patent: Jul. 28, 2015

(54) METHOD FOR MANUFACTURING SOLAR CELL

(75) Inventors: Deoc Hwan Hyun, Daejeon (KR); Jae Eock Cho, Daejeon (KR); Dong Ho Lee, Daejeon (KR); Gui Ryong Ahn, Daejeon (KR); Hyun Cheol Ryu, Daejeon (KR); Yong Hwa Lee, Seoul (KR); Gang Il Kim, Seoul (KR)

(73) Assignee: HANWHA CHEMICAL CORPORATION, Seoul (KR)

( * ) Notice: Subject to any disclaimer, the term of this patent is extended or adjusted under 35 U.S.C. 154(b) by 90 days.

(21) Appl. No.: 14/008,007

(22) PCT Filed: Feb. 24, 2012

(86) PCT No.: PCT/KR2012/001410
§ 371 (c)(1),
(2), (4) Date: Sep. 27, 2013

(87) PCT Pub. No.: WO2012/134062
PCT Pub. Date: Oct. 4, 2012

(65) Prior Publication Data
US 2014/0017847 A1    Jan. 16, 2014

(30) Foreign Application Priority Data
Mar. 30, 2011    (KR) .................. 10-2011-0028770

(51) Int. Cl.
*H01L 21/00* (2006.01)
*H01L 31/0236* (2006.01)
(Continued)

(52) U.S. Cl.
CPC ........ *H01L 31/02363* (2013.01); *H01L 31/068* (2013.01); *H01L 31/1804* (2013.01); *Y02E 10/52* (2013.01); *Y02E 10/547* (2013.01)

(58) Field of Classification Search
CPC ............... H01L 31/022425; H01L 31/1804; H01L 31/068; H01L 31/18; H01L 31/02363; H01L 31/02167; H01L 31/0322; H01L 31/048; H01L 31/0749; H01L 31/022441; H01L 31/0682; H01L 31/0725; H01L 31/078
USPC ............ 257/E21.568; 438/71, 458, 480, 689, 438/795
See application file for complete search history.

(56) References Cited

U.S. PATENT DOCUMENTS

2009/0260681 A1    10/2009   Yun et al.
2010/0087030 A1    4/2010    Kim
(Continued)

FOREIGN PATENT DOCUMENTS

JP    2004-146491    5/2004
JP    2006-310368    11/2006
(Continued)

OTHER PUBLICATIONS

Notification of Office Action issued on Aug. 20, 2014 for corresponding Japanese Patent Application No. 2014-502444.
(Continued)

*Primary Examiner* — Mark A Laurenzi
(74) *Attorney, Agent, or Firm* — Lowe Hauptman & Ham, LLP

(57) ABSTRACT

Provided is a method of manufacturing a solar cell, wherein a solar cell is manufactured by combining a damage removal etching process, a texturing process and an edge isolation process. The method is advantageous in that RIE and DRE are conducted, and then DRE/PSG and/or an edge isolation removal process are simultaneously conducted, so that the movement of a substrate (that is, a wafer) is minimized, thereby reducing the damage rate of the substrate.

14 Claims, 6 Drawing Sheets

(51) Int. Cl.
*H01L 31/068* (2012.01)
*H01L 31/18* (2006.01)

(56) References Cited

U.S. PATENT DOCUMENTS

| 2012/0000517 | A1 | 1/2012 | Yun et al. |
| 2012/0003781 | A1 | 1/2012 | Yun et al. |
| 2012/0040489 | A1 | 2/2012 | Kim |

FOREIGN PATENT DOCUMENTS

| KR | 1020080100057 | 11/2008 |
| KR | 1020090054732 | 6/2009 |
| KR | 1020090091562 | 8/2009 |
| KR | 100990108 | 10/2010 |
| KR | 1020110003788 | 1/2011 |
| WO | 2006/087786 | 8/2006 |

OTHER PUBLICATIONS

International Search Report for corresponding International Application No. PCT/KR12/001410.
European Search Report for corresponding European Patent Application No. 12 76 3636, dated Oct. 27, 2014.
Schaefer Sebastian et al., "Low Damage Reactive Ion Etching for Photovoltaic Applications," Journal of Vacuum Science and Technology: Part A, AVS/AIP, Melville, NY, vol. 17, No. 3, May 1, 1999.

METHOD FOR MANUFACTURING SOLAR CELL

TECHNICAL FIELD

The present invention relates to a method of manufacturing a solar cell, and more particularly, to a method of manufacturing a solar cell, wherein a solar cell is manufactured by combining a damage removal etching process, a texturing process and an edge isolation process.

BACKGROUND ART

Recently, as the existing energy resources, such as oil, coal and the like, became exhausted, alternative energy sources thereto have attracted attention. Among these alternative energy sources, solar cells are receiving particular attention because they are resourceful and do not cause environmental problems.

Solar cells include solar heat cells that generate steam necessary to rotate a turbine using solar heat and solar light cells that convert solar energy into electric energy using semiconductor properties. Solar cells are generally called solar light cells (hereinafter, referred to as 'solar cells').

Solar cells are largely classified into silicon solar cells, compound-semiconductor solar cells and tandem solar cells according to raw materials. Among these three kinds of solar cells, silicon solar cells are generally used in the solar cell market.

When solar light enters such a solar cell, electrons and holes are generated from a silicon semiconductor doped with impurities by a photovoltaic effect.

Such electrons and holes are respectively drawn toward an N-type semiconductor and a P-type semiconductor to move to an electrode connected with a lower portion of a substrate and an electrode connected with an upper portion of an emitter doping layer. When these electrodes are connected with each other by electric wires, electric current flows.

In this case, a conventional solar cell is manufactured by the following processes of: ① texturing; ② doping (forming a PN Junction); ③ removing an oxide film (PSG: phosphor silicate glass); ④ forming an anti-reflective film (ARC: anti-reflective coating); ⑤ metallizing; and ⑥ measuring edge isolation.

The texturing of a conventional solar cell (for example, a polycrystalline silicon solar cell) was mostly conducted using an acid solution (HNO3/HF composition). In addition, the texturing thereof was conducted by performing a wet SDR (sawing damage removal) process and then decreasing reflexibility using RIE (reactive ion etching) texturing and thus improving Isc (shot-circuit current: reverse (negative) current density occurring when light is applied in a state in which a circuit is shorted, that is, in a state in which external resistance does not exist.

In the case of RIE texturing, due to surface plasma damage, it is difficult to realize the degree of increase of efficiency attributable to the decrease of FF (fill factor) and Voc (open-circuit voltage) regardless of low reflexibility. In order to remove such plasma damage, a DRE (damage removal etching) process is carried out. That is, the conventional RIE texturing includes: ① a wet SDR process; ② an RIE process; ③ a DRE process; ④ a doping process; ⑤ a PSG removal process; and ⑥ other conventional solar cell processes.

In order to accomplish a conversion efficiency of about 15% using a polycrystalline substrate (that is, a wafer), surface texturing is not the most important factor. However, in order to manufacture a polycrystalline solar cell having a conversion efficiency of 16% or more, a texturing process capable of trapping light can be issued.

Such a conventional texturing process includes a wet etching process. A wet etching apparatus is provided in order to conduct such a wet etching process. Meanwhile, the RIE process is carried out by dry etching, whereas the DRE process is carried out by wet etching. Therefore, an additional wet etching apparatus is required in addition to RIE equipment.

Accordingly, owing to the above wet etching process and wet etching apparatus, there is a problem in that the damage rate of a substrate (that is, a wafer) increases.

Further, since an additional wet etching apparatus is required in order to perform the above wet etching process, there is a problem in that the installation and maintenance costs thereof increase.

DISCLOSURE

Technical Problem

The present invention has been devised to solve the above-mentioned problems, and an object of the present invention is to provide a method of manufacturing a solar cell, which can reduce the damage rate of a substrate occurring during a process.

Another object of the present invention is to provide a method of manufacturing a solar cell, in which installation and maintenance costs can be reduced because an additional wet etching apparatus for performing a wet etching process is not required.

Technical Solution

In order to accomplish the above objects, an aspect of the present invention provides a method of manufacturing a solar cell, including: sawing a substrate and then removing a damage from a surface of the substrate using an SDR (saw damage removal) process; texturing the surface of the substrate using an RIE (reactive ion etching) process; doping the surface of the substrate with a doping material different from a material constituting the substrate; simultaneously removing a damage and an oxide film (phosphoric silicate glass (PSG)) from the surface of the substrate; forming an anti-reflective coating on the surface of the substrate; irradiating an edge of the substrate with laser using laser etching to isolate the edge from the antireflective film; and metallizing the substrate to form a front electrode and a rear electrode on front and rear sides thereof.

Here, the removing of the damage and the oxide film may include: removing the damage from the surface of the substrate using a low-concentration solution containing KOH or NH4OH/H2O/H2O2; and cleaning the surface of the substrate using a solution containing HCL/HF.

Further, the removing of the damage and the oxide film may be conducted by one wet etching apparatus.

Another aspect of the present invention provides a method of manufacturing a solar cell, including: sawing a substrate and then removing a damage from a surface of the substrate using an SDR (saw damage removal) process; texturing the surface of the substrate using an RIE (reactive ion etching) process; doping the surface of the substrate with a doping material different from a material constituting the substrate; primarily removing a damage and an oxide film (phosphoric silicate glass (PSG)) from the surface of the substrate; secondarily removing the residual damage and oxide film (PSG)

from the surface of the substrate and wet-etching an edge of the substrate to isolate the edge from an anti-reflective film; forming the anti-reflective coating on the surface of the substrate; and metallizing the substrate to form a front electrode and a rear electrode on front and rear sides thereof.

Here, the edge isolation may include: etching the back side of the substrate using a solution containing HNO3/H2SO2/H2O2 to isolate the edge from the anti-reflective film; removing the damage from the surface of the substrate using a low-concentration solution containing KOH or NH4OH/H2O/H2O2; and cleaning the surface of the substrate using a solution containing HCL/HF. Further, the removing of the damage may be conducted by acid texturing or alkali saw damage removal, and in the acid texturing, the sawing damage removal of the substrate and the texturing of the surface of the substrate may be simultaneously conducted.

Further, the substrate may be doped with an impurity selected from elements of group III and elements of group V.

Advantageous Effects

According to the present invention, RIE and DRE are conducted, and then DRE/PSG and/or an edge isolation removal process are simultaneously conducted, so that the movement of a substrate (that is, a wafer) is minimized, thereby reducing the damage rate of the substrate.

Further, according to the present invention, DRE/PSG and/or an edge isolation removal process are simultaneously conducted in one wet etching apparatus, so that the number of wet etching apparatuses can be reduced, thereby reducing the installation and maintenance costs thereof.

DESCRIPTION OF DRAWINGS

The above and other objects, features and advantages of the present invention will become apparent from the following description of preferred embodiments given in conjunction with the accompanying drawings, in which.

REFERENCE NUMERALS

Figure 1:
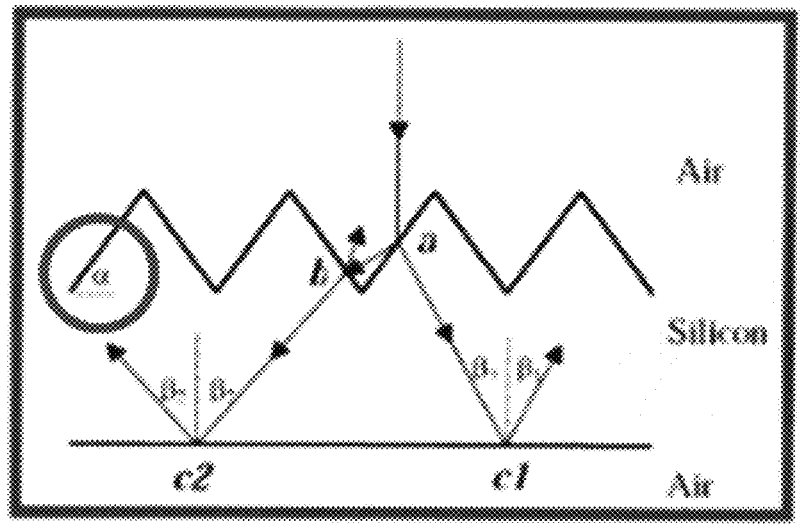
FIG. 1 is a view showing the reflection pathway of light depending on the uneven structure of the surface of a general solar cell.

α: angle of structure
β: reflection angle and/or incident angle
a: first light pathway
b: second light pathway
c1, c2: reflection points
30: substrate
32: emitter layer
34: anti-reflective coating
36: rear electrode
38: front electrode
39: rear electric field layer
40: edge

BEST MODE

The present invention may be variously changed and may have various embodiments. Hereinafter, preferred embodiments of the present invention will be described in detail with reference to the accompanying drawings. However, the present invention is not limited to these embodiments, and may include any and all modifications, variations, equivalents, substitutions and the like within the scope of the invention. Further, the same reference numerals are used throughout the accompanying drawings to designate the same or similar components.

The terms •first,• •second,• and the like may be used to explain various other components, but these components are not limited to the terms. The terms are used only to distinguish a certain component from other components. For example, a first component may be called a second component, and a second component may also be called a first component without departing from the scope of the present invention. The term •and/or• means a combination of related components or any one of related components.

When it is mentioned that a certain component is connected to another component, it will be understood that the certain component is directly connected to another component, or a further component may be located therebetween. In contrast, when it is mentioned that a certain component is directly connected to another component, it will be understood that a further component is not located therebetween.

The terms used in the present specification are set forth to explain the embodiments of the present invention, and the scope of the present invention is not limited thereto. The singular number includes the plural number as long as they are not apparently different from each other in meaning. In the present specification, it will be understood that the terms •have,• •include,• •comprise,• and the like are used to designate features, figures, steps, operations, components, parts or combination thereof, and do not exclude them.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe the best method he or she knows for carrying out the invention.

Hereinafter, preferred embodiments of the present invention will be described in detail with reference to the attached drawings.

FIG. 1 is a view showing the reflection pathway of light depending on the uneven structure of the surface of a general solar cell. Generally, a silicon solar cell includes a substrate made of a p-type silicon semiconductor and an emitter doping layer, wherein a p-n junction is formed at the interface between the substrate and the emitter doping layer, similarly to a diode.

When solar light enters a solar cell having such a structure, electrons and holes are generated from a silicon semiconductor doped with impurities by a photovoltaic effect.

For reference, electrons are generated from an emitter doping layer made of an n-type silicon semiconductor as carriers, and holes are generated from a substrate made of a p-type silicon semiconductor as carriers.

The electrons and holes generated by a photovoltaic effect are respectively drawn toward an n-type semiconductor and a p-type semiconductor to move to an electrode connected with the lower portion of the substrate and an electrode connected with the upper portion of the emitter doping layer. When these electrodes are connected with each other by electric wires, electric current flows.

Therefore, in order to increase light absorption, the surface of a solar cell is textured. The objects of texturing the surface thereof are to increase the amount of the light absorbed by the multireflection from the front to the inside thereof and to increase the length of the pathway of light.

Consequently, the short-circuit current (Isc) of a solar cell can be improved. The reflexibility of a hard-faced silicon surface is about 30%, and is reduced by about 10% through texturing. In this case, when an anti-reflective coating is additionally formed, the reflexibility thereof is reduced to 3%.

When a monocrystalline silicon wafer is textured, a pyramid structure is formed. In this case, the angle of the pyramid structure plays an important role in the direction of transmission of light. FIG. 1 shows such a pyramid structure. That is, FIG. 1 is a view showing the angle of the pyramid structure (uneven structure) and the reflection pathway of light depending on the angle thereof.

i) If the angle of the pyramid structure is α=30°, light is reflected two times only at the lower end of a V-shaped groove thereof.

ii) If the angle of the pyramid structure is α=45°, incident light is reflected two times.

iii) If the angle of the pyramid structure is α=60°, incident light is reflected three times.

Therefore, as the angle of the pyramid structure increases, the number of incident light being reflected increases, and thus short-circuit current (Isc), which is photocurrent, increases.

Figure 2:
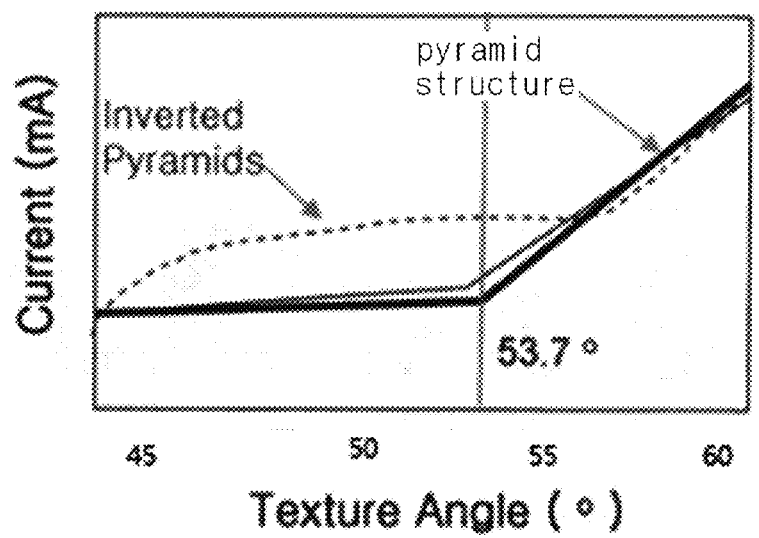
FIG. 2 is a graph showing the change of short-circuit current (Isc) depending on the uneven structure of FIG. 1.

FIG. 2 shows such a phenomenon. That is, FIG. 2 is a graph showing the change of short-circuit current (Isc) depending on the pyramid structure (uneven structure) of FIG. 1. Referring to FIG. 2, it can be seen that short-circuit current (Isc) rapidly increases when the angle of the pyramid structure is 53.7° or more.

The effect of texturing is represented by the following Formula 1:

Random structure ≪ front/rear regular pyramid structure ≪ front pyramid structure [Formula 1]

Here, when the front and rear sides thereof are textured, the efficiency of the pyramid structure is decreased due to the recombination of the rear side with the front side thereof, so that the efficiency of the front/rear regular pyramid structure becomes lower than that of the front pyramid structure.

Figure 3:
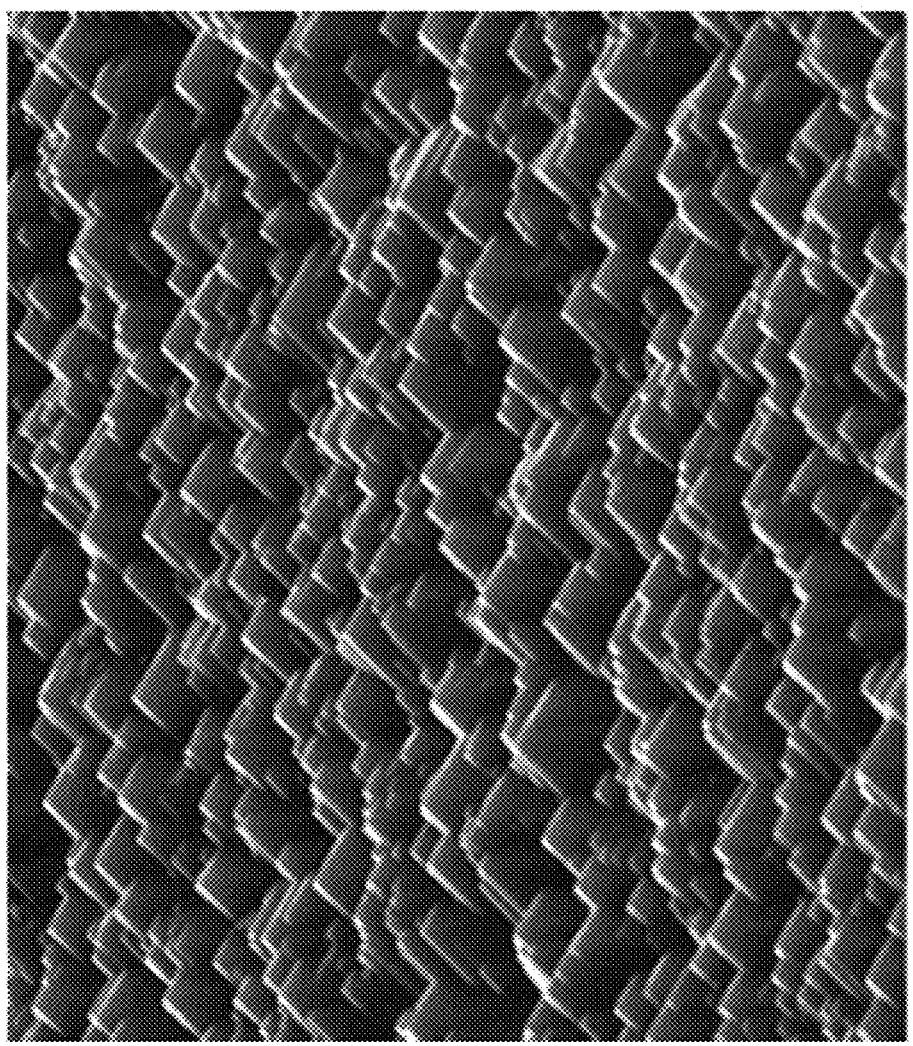
FIG. 3 is an enlarged view showing the surface of a monocrystalline substrate textured by alkali etching.

FIG. 3 shows the surface of such a pyramid structure. That is, FIG. 3 is an enlarged view showing the textured surface of a monocrystalline substrate. FIG. 3 shows the surface of a monocrystalline substrate (that is, a wafer) textured by an alkaline solution containing NaOH or KOH.

In the case of a monocrystalline substrate (that is, a wafer), it is possible to texture the silicon surface thereof using an alkaline solution containing NaOH or KOH. In a diamond lattice structure, atoms are more densely collected in the 111 plane than in the 100 plane, so the etching rate of the 111 plane is low compared to that of the 100 plane. Therefore, bubbles formed on the silicon surface reduce the etching rate, thus enabling the silicon surface to be textured.

Figure 4:
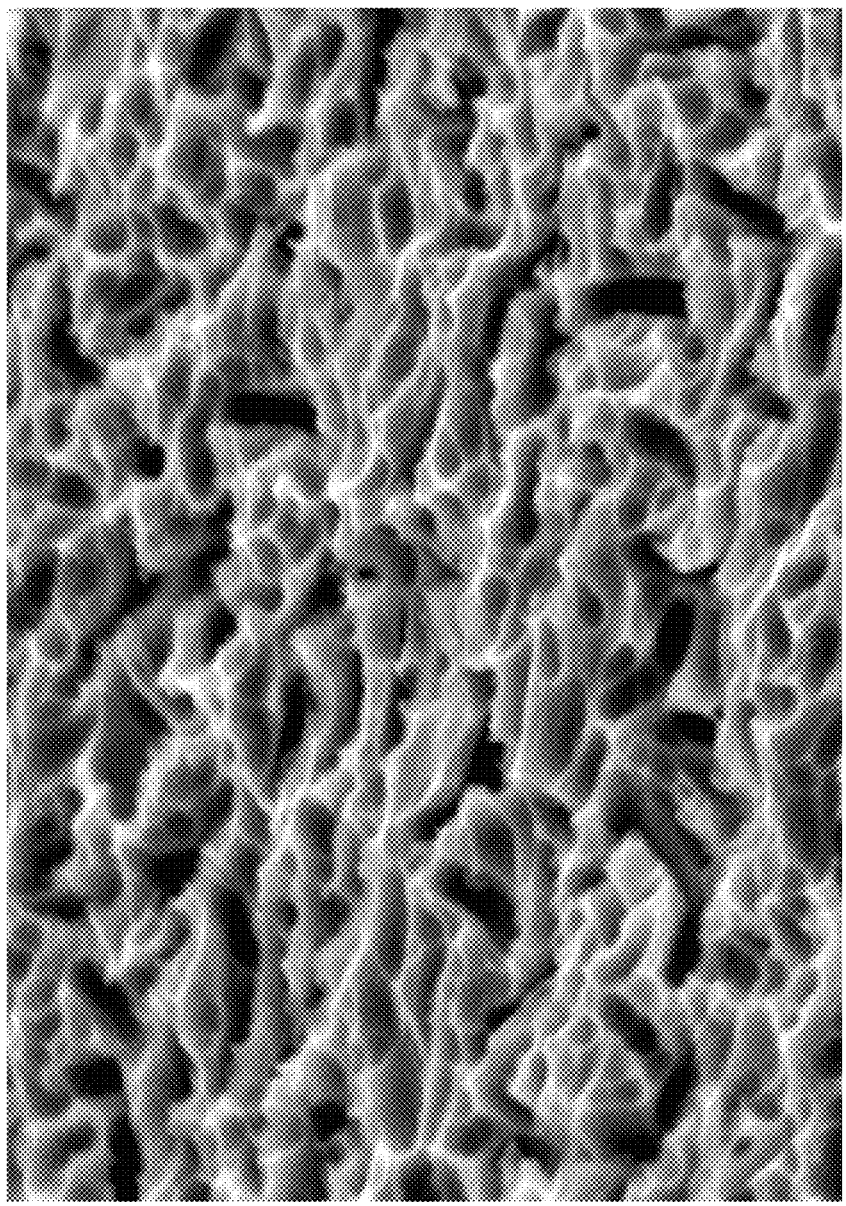
FIG. 4 is an enlarged view showing the surface of a polycrystalline substrate textured by acid etching.

In contrast, FIG. 4 is an enlarged view showing the textured surface of a polycrystalline substrate. In the case of a polycrystalline substrate, since crystal orientation is not constant, isotropic etching using acid solution is advantageous. The acid solution basically includes HF, HNO3 and DI. Here, HNO3 oxidizes the silicon surface (that is, the surface of the substrate), and HF removes the oxidized silicon surface.

The texturing of a polycrystalline substrate can be conducted by a laser method, a diamond blade method and the like as well as the above-mentioned chemical method. In the diamond blade method, the surface of the substrate is mechanically treated, and is then chemically treated using a chemical solution to remove defects from the surface thereof to provide a regular pyramid structure having an inclination angle of about 35° on the surface thereof.

Even when texturing is conducted using dry etching as well as wet etching, it is not required to use a photoprint process or a mask. Here, in the case of dry etching, an extremely low reflexibility of about 2% is obtained. Further, in this case, the surface of the substrate can be damaged by ions occurring during plasma etching, so it is required to remove the defects from the surface thereof.

In RIE (reactive ion etching), high-energy ions are applied onto a substrate, compared to in plasma etching. The reason for this is because high negative potential is formed at an electrode compared to at the grounded electrode. In RIE (reactive ion etching), Cl2/SF6/O2, are generally used as etching gas, and, if necessary, CF4/CHF3 may be used. In the case of dry etching not using O2, it is very difficult to adjust the shape of the etched substrate.

In order to adjust the shape of the etched substrate, a film is formed such that the lateral side of the substrate is not etched or the etching rate of the substrate is remarkably decreased using a sidewall passivation layer.

That is, when O2 is added to the etching gas, the lateral side of the substrate, to which ions are not applied, is formed with a film, and the lower side thereof, to which ions are applied, is not formed with a film, so that only the lower side thereof is etched, thus adjusting the shape of the etched substrate. When such a principle is used, extremely low reflexibility (the weighted average value in a wavelength band of 400~1000 nm is 2% or less) can be obtained. However, surface damage is caused by the shock attributable to the RIE texturing, so that surface recombination occurs, with the result that attainable current is reduced. Further, surface damage causes low Voc and low FF. Therefore, a damage removal etching (DRE) process is required in order to solve both the low reflexibility and the electrical surface damage.

As described above, in the RIE texturing, the surface damage caused by plasma must be removed. When the surface damage is not removed, the surface recombination rate is increased, so that current value is decreased, with the result that it is difficult to expect a cell conversion efficiency to increase. That is, although the amount of absorbed light is increased by RIE, electron-hole pairs are rapidly extinguished, and thus the effect of light absorption cannot be obtained.

However, when overetching is performed in the DRE process, the surface pattern formed by RIE disappears, so that the effect of reduction of reflexibility cannot be obtained, with the result that the absorption of light cannot be enhanced. Therefore, in order to successfully conduct the RIE process, optimal DRE conditions, under which low reflexibility can be secured by maintaining RIE pattern and surface damage can be effective removed, must be satisfied.

Figure 5:
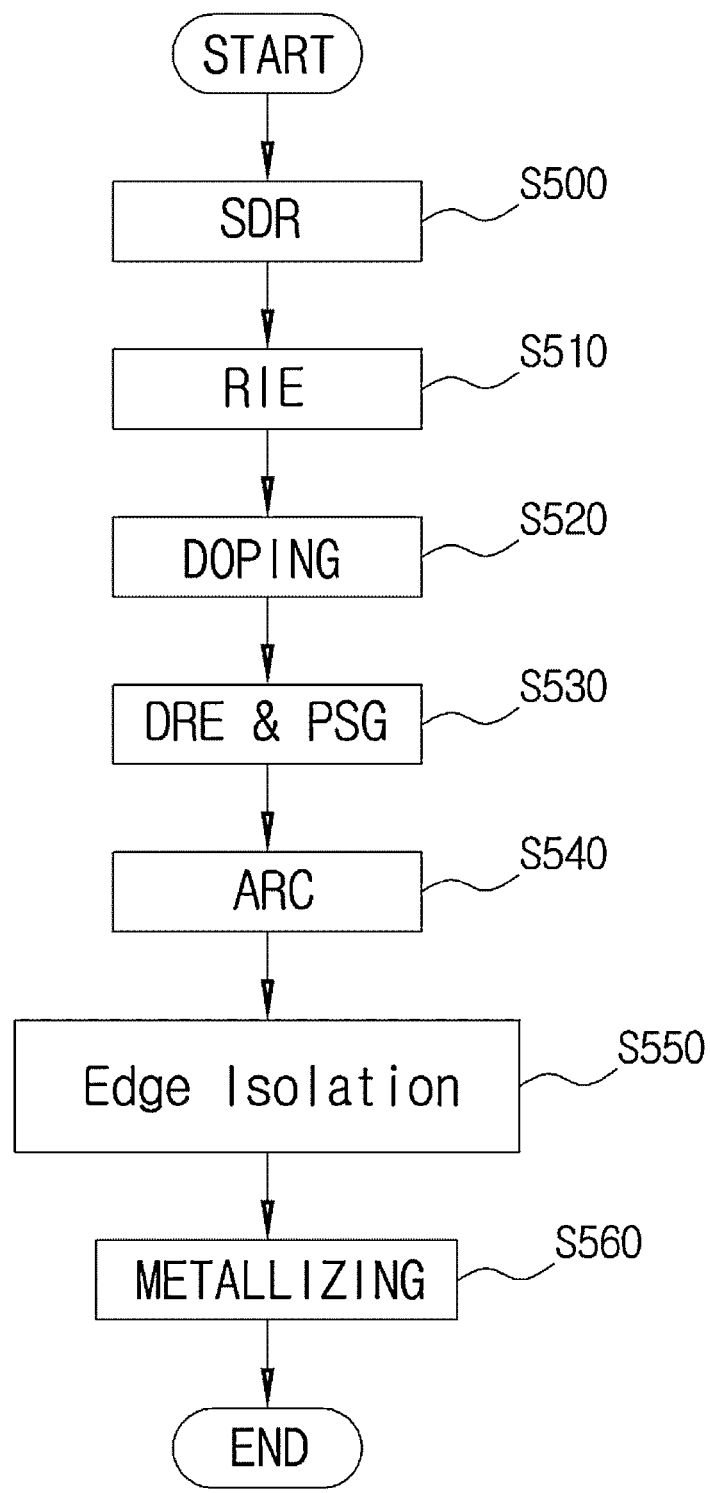
FIG. 5 is a flowchart showing a process of manufacturing a solar cell using RIE (reactive ion etching), in which edge isolation is performed by laser etching, according to a first embodiment of the present invention.

Therefore, in a first embodiment of the present invention, a DRE (damage removal etching) process and a PSG (phosphor silicate glass) removal process are simultaneously conducted. FIG. 5 shows a flowchart for conducting such processes. That is, FIG. 5 is a flowchart showing a process of manufacturing a solar cell using RIE (reactive ion etching), in which edge isolation is performed by laser etching, according to the first embodiment of the present invention.

Referring to FIG. 5, first, a SDE (saw damage etching) process of sawing a silicon substrate for a solar cell to a predetermined size and then removing surface damage is conducted (S500).

Concretely, an SDR (sawing damage removal) process is required in order to remove the damage caused by sawing the substrate. In this case, the damage caused by sawing the substrate is removed by the SDE (saw damage etching) process. This SDE process is a process of etching the surface of the substrate using chemical or removing an oxide film (phosphoric silicate glass layer) formed on the surface thereof.

Subsequently, an RIE (reactive ion etching) process of texturing the substrate, which is a process of scratching the substrate, is conducted (S510).

Thereafter, in order to impart the surface of the substrate with conductivity, a doping process of diffusing different types of impurities (for example, elements of group V or elements of group III) to form an emitter is conducted (S520).

Subsequently, in order to remove the damage formed on the surface of the substrate during the doping process, a DRE (damage removal etching) process is conducted, and simultaneously an oxide film (PSG) is removed (S530). When the DRE process and the oxide film (PSG) removal process are simultaneously conducted, the DRE process is conducted by removing the damage formed on the surface of the substrate using a low-concentration solution containing KOH or a low-concentration solution containing NH4OH/H2O/H2O2, and the oxide film (PSG) removal process is conducted by cleaning the substrate using a solution containing HCl/HF.

Thereafter, in order to improve the efficiency of a solar cell by preventing the reflection of solar light, a process for forming an anti-reflective coating (ARC) is conducted (S540).

Subsequently, an edge isolation process is conducted (S550). Concretely, since the edge of the substrate is also doped with a doping material, the front and rear electrodes of the substrate are electrically connected with each other, thus causing the efficiency of a solar cell to be lowered. Therefore, the edge isolation process is conducted in order to isolate the front electrode from the rear electrode.

Such an edge isolation process may be conducted after the doping process (S520).

After the edge isolation process (S550), a metallization process of forming a front electrode and a rear electrode is conducted (S560).

As shown in FIG. 5, when the DRE (damage removal etching) process and the PSG (phosphor silicate glass) removal process were simultaneously conducted according to the first embodiment of the present invention, the conversion efficiency thereof was compared with that of a conventional technology, and the results thereof is given in Table 1 below.

TABLE 1

|  | Isc (A) | Voc (mA) | FF (%) | Eff (%) |
|---|---|---|---|---|
| Conventional technology | 7.982 | 619 | 78.44 | 15.94 |
| First embodiment | 7.976 | 619 | 78.61 | 15.96 |

Here, Isc is short circuit current, Voc is open circuit voltage, FF is fill factor, and Eff is light conversion efficiency.

Figure 6:
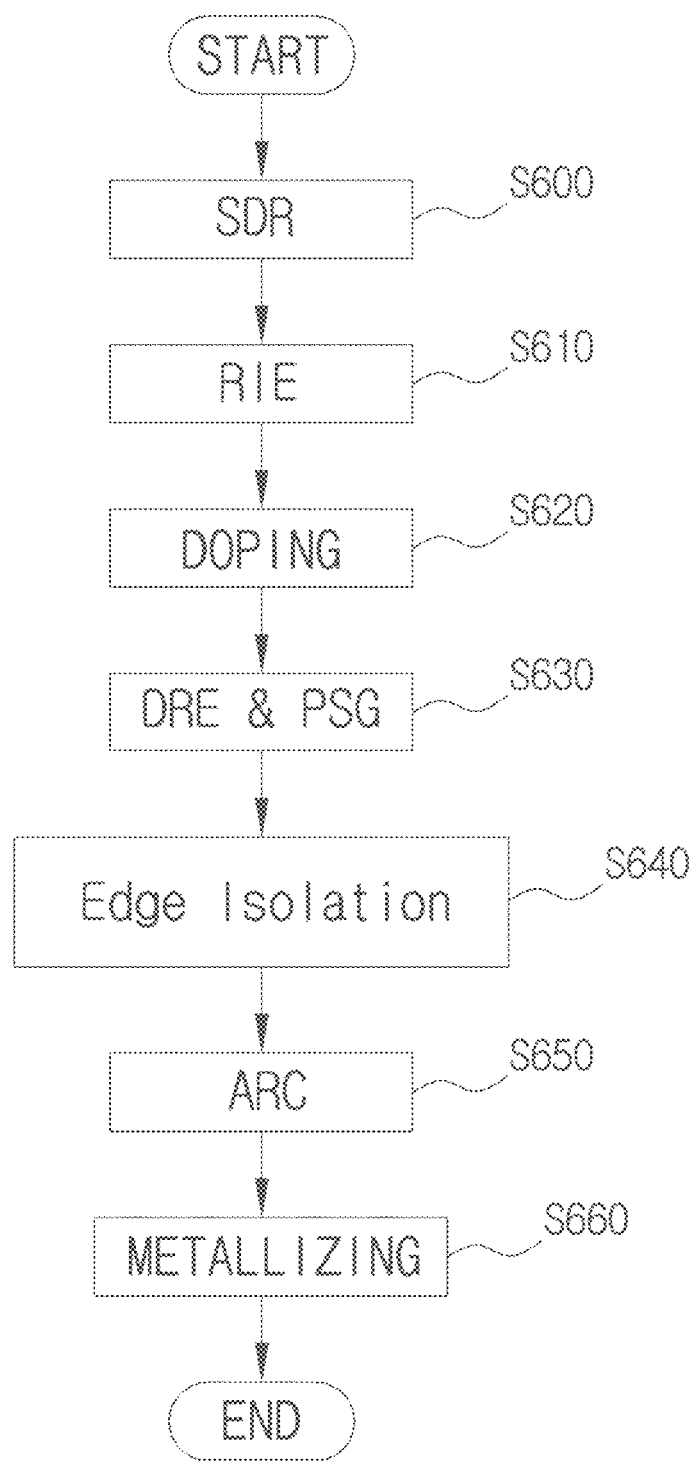
FIG. 6 is a flowchart showing a process of manufacturing a solar cell using RIE (reactive ion etching), in which edge isolation is performed by wet etching, according to a second embodiment of the present invention.

According to a second embodiment of the present invention, an edge isolation process, a DRE process and a PSG removal process are simultaneously conducted. FIG. 6 shows a flowchart for conducting such processes. That is, FIG. 6 is a flowchart showing a process of manufacturing a solar cell using RIE (reactive ion etching), in which edge isolation is performed by wet etching, according to the second embodiment of the present invention.

Referring to FIG. 6, an SDR process, an RIE process, a doping process and a DRE&PSG removal process are conducted in the same manner as in FIG. 5 (S600 to S630).

Here, the DRE&PSG removal process (S630) is a first DRE&PSG removal process, and the first DRE&PSG removal process is different from a second DRE&PSG removal process which is conducted together with the edge isolation process. Generally, in the case of wet etching, the DRE&PSG removal process is conducted in one wet etching apparatus. However, in FIG. 6, the first DRE&PSG removal process is conducted, and then the edge isolation process and the second DRE&PSG removal process are simultaneously conducted (S640).

Here, the edge isolation process is conducted by etching the back side of the substrate using a solution containing HNO3/H2SO2/H2O2, the DRE process is conducted by removing the damage formed on the surface of the substrate using a low-concentration solution containing KOH or a low-concentration solution containing NH4OH/H2O/H2O2, and the PSG removal process is conducted by cleaning the substrate using a solution containing HF.

In this case, the concentration of each of the solutions is adjusted such that the reflexibility of the substrate attributable to the RIE texturing is 15% or less and the change in surface resistance of the substrate is 10% or less.

After the edge isolation process (S640), in order to improve the efficiency of a solar cell by preventing the reflection of solar light, a process for forming an anti-reflective coating (ARC) is conducted (S650).

Subsequently, a metallization process of forming a front electrode and a rear electrode is conducted (S660).

Figure 7:
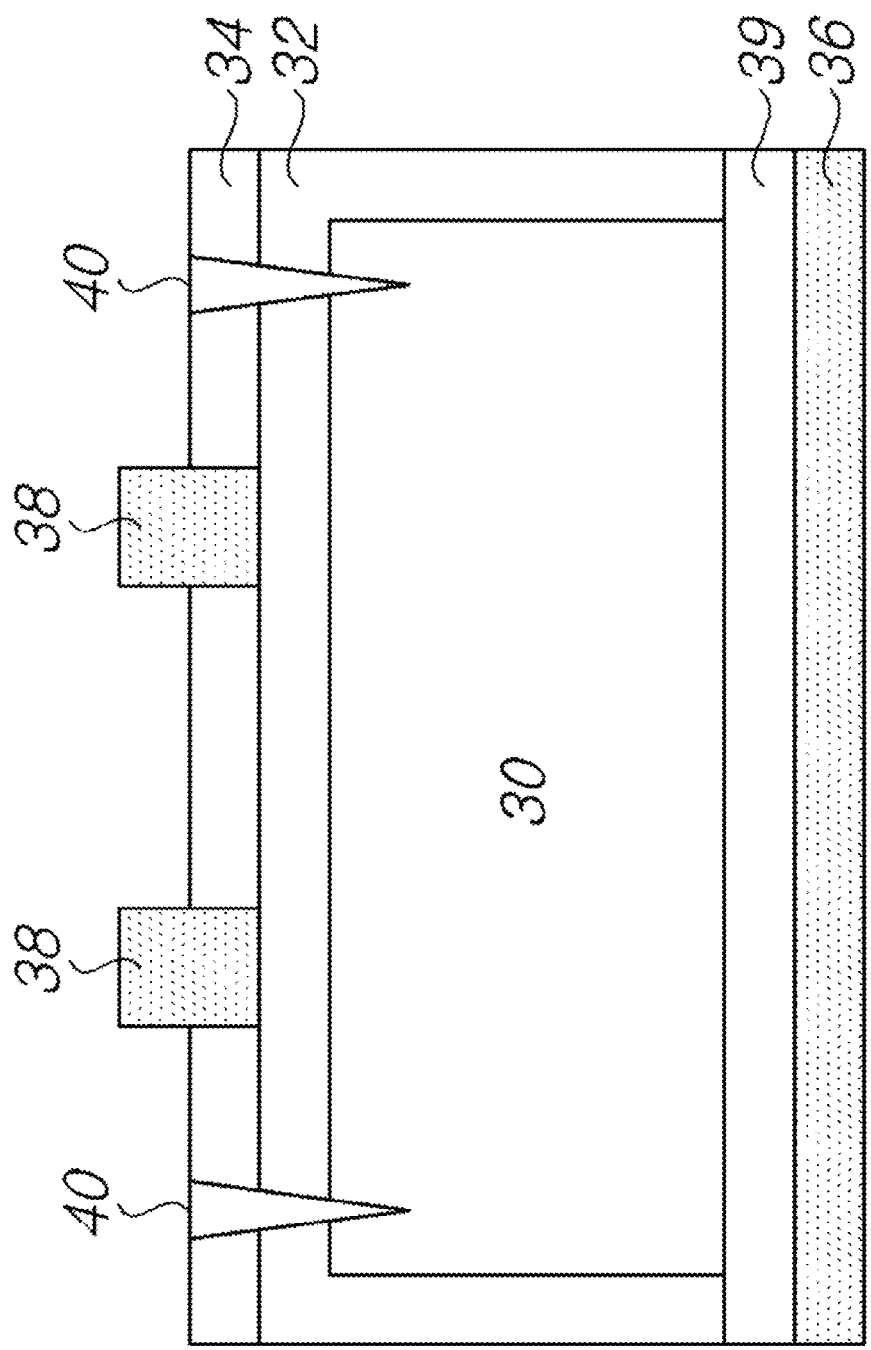
FIG. 7 is a sectional view showing a solar cell finished by edge isolation according to the present invention.

FIG. 7 is a sectional view showing a solar cell finished by edge isolation according to the present invention. As shown in FIG. 7, the solar cell is configured such that a substrate is provided with an emitter layer 32, an anti-reflective coating 34, a front electrode 38, a rear electrode 36 and a rear electric field layer 39, and the edges 40 of the emitter layer 32 and the anti-reflective coating 34 are removed. Therefore, it is possible to prevent the rear electrode and the front electrode 38 from being shunted.

Here, the structure of the solar cell shown in FIG. 7 may be changed because it is set forth to understand the present invention, and those skilled in the art can understand the change in the structure thereof.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A method of manufacturing a solar cell, comprising:
    sawing a substrate and then removing a damage from a surface of the substrate using an SDR (saw damage removal) process;
    texturing the surface of the substrate using an RIE (reactive ion etching) process;
    doping the surface of the substrate with a doping material different from a material constituting the substrate;

simultaneously removing a damage and an oxide film (phosphoric silicate glass (PSG)) from the surface of the substrate;

forming an anti-reflective coating on the surface of the substrate;

irradiating an edge of the substrate with laser using laser etching to isolate the edge from the antireflective film; and metallizing the substrate to form a front electrode and a rear electrode on front and rear sides thereof.

2. The method of claim 1, wherein the removing of the damage and the oxide film comprises:

removing the damage from the surface of the substrate using a low-concentration solution containing KOH or NH4OH/H2O/H2O2; and cleaning the surface of the substrate using a solution containing HCL/HF.

3. The method of claim 1, wherein the removing of the damage and the oxide film is conducted by one wet etching apparatus.

4. The method of claim 1, wherein the removing of the damage is conducted by acid texturing or alkali saw damage removal, and in the acid texturing, the sawing damage removal of the substrate and the texturing of the surface of the substrate are simultaneously conducted.

5. The method of claim 1, wherein the substrate is doped with an impurity selected from elements of group III and elements of group V.

6. A method of manufacturing a solar cell, comprising:

sawing a substrate and then removing a damage from a surface of the substrate using an SDR (saw damage removal) process;

texturing the surface of the substrate using an RIE (reactive ion etching) process;

doping the surface of the substrate with a doping material different from a material constituting the substrate;

primarily removing a damage and an oxide film (phosphoric silicate glass (PSG)) from the surface of the substrate;

secondarily removing the residual damage and oxide film (PSG) from the surface of the substrate and wet-etching an edge of the substrate to isolate the edge from an anti-reflective film;

forming the anti-reflective coating on the surface of the substrate; and metallizing the substrate to form a front electrode and a rear electrode on front and rear sides thereof.

7. The method of claim 6, wherein the edge isolation comprises:

etching the back side of the substrate using a solution containing HNO3/H2SO2/H2O2 to isolate the edge from the anti-reflective film;

removing the damage from the surface of the substrate using a low-concentration solution containing KOH or NH4OH/H2O/H2O2; and cleaning the surface of the substrate using a solution containing HCL/HF.

8. The method of claim 6, wherein the removing of the damage is conducted by acid texturing or alkali saw damage removal, and in the acid texturing, the sawing damage removal of the substrate and the texturing of the surface of the substrate are simultaneously conducted.

9. The method of claim 6, wherein the substrate is doped with an impurity selected from elements of group III and elements of group V.

10. The method of claim 2, wherein the removing of the damage and the oxide film is conducted by a wet etching apparatus.

11. The method of claim 2, wherein the removing of the damage is conducted by acid texturing or alkali saw damage removal, and in the acid texturing, the sawing damage removal of the substrate and the texturing of the surface of the substrate are simultaneously conducted.

12. The method of claim 2, wherein the substrate is doped with an impurity selected from elements of group III and elements of group V.

13. The method of claim 7, wherein the removing of the damage is conducted by acid texturing or alkali saw damage removal, and in the acid texturing, the sawing damage removal of the substrate and the texturing of the surface of the substrate are simultaneously conducted.

14. The method of claim 7, wherein the substrate is doped with an impurity selected from elements of group III and elements of group V.

* * * * *